US008361227B2

(12) United States Patent
Zwieback et al.

(10) Patent No.: US 8,361,227 B2
(45) Date of Patent: Jan. 29, 2013

(54) SILICON CARBIDE SINGLE CRYSTALS WITH LOW BORON CONTENT

(75) Inventors: Ilya Zwieback, Washington Township, NJ (US); Thomas E. Anderson, Convent Station, NJ (US); Avinash K. Gupta, Basking Ridge, NJ (US)

(73) Assignee: II-VI Incorporated, Saxonburg, PA (US)

(\*) Notice: Subject to any disclaimer, the term of this patent is extended or adjusted under 35 U.S.C. 154(b) by 1509 days.

(21) Appl. No.: 11/900,242

(22) Filed: Sep. 11, 2007

(65) Prior Publication Data
US 2008/0072817 A1    Mar. 27, 2008

Related U.S. Application Data

(63) Continuation-in-part of application No. 11/784,971, filed on Apr. 10, 2007.

(60) Provisional application No. 60/847,318, filed on Sep. 26, 2006.

(51) Int. Cl.
*C30B 21/02*    (2006.01)
(52) U.S. Cl. ............................................. 117/102
(58) Field of Classification Search .................... 117/102
See application file for complete search history.

(56) References Cited

U.S. PATENT DOCUMENTS

| | | | |
|---|---|---|---|
| 3,424,628 A * | 1/1969 | Winings | 438/508 |
| 5,611,955 A | 3/1997 | Barrett et al. | |
| 5,667,587 A | 9/1997 | Glass et al. | |
| 5,683,507 A | 11/1997 | Barrett et al. | |
| 5,693,565 A * | 12/1997 | Camilletti et al. | 438/17 |
| 5,746,827 A | 5/1998 | Barrett et al. | |
| 6,814,801 B2 | 11/2004 | Jenny et al. | |
| 2006/0024439 A2 * | 2/2006 | Tuominen et al. | 427/248.1 |

FOREIGN PATENT DOCUMENTS

DE    EP1567696 B1 *    7/2004
WO    WO 2006/017074 A2 *    2/2006

OTHER PUBLICATIONS

Machine translation of EP1567696B1, Rasp et al.*
Machine translation of EP 1567696, Rasp et al Jul. 2004.*
Y. M. Tairov and V. F. Tsvetkov; "Investigation of Growth Processes of Ingots of Silicon Carbide Single Crystals", Journal of Crystal Growth, vol. 43 (1978) pp. 209-212.

(Continued)

*Primary Examiner* — Bob M Kunemund
(74) *Attorney, Agent, or Firm* — The Webb Law Firm

(57) ABSTRACT

In a crystal growth method, an enclosed growth crucible is provided inside of a growth chamber. The growth crucible has polycrystalline source material and a seed crystal disposed in spaced relation therein. The interior of the growth crucible is heated whereupon a temperature gradient forms between the source material and the seed crystal. The temperature gradient is sufficient to cause the source material to sublimate and be transported to the seed crystal where it precipitates on the seed crystal. A gas mixture is caused to flow into the growth crucible and between the polycrystalline source material and an interior surface of the growth crucible. The gas mixture reacts with an unwanted element in the body of the growth crucible to form a gaseous byproduct which then flows through the body of the growth crucible to the exterior of the growth crucible.

24 Claims, 3 Drawing Sheets

OTHER PUBLICATIONS

A. Elison et al.; "SiC Crystal Growth by HTCVD", Mat. Sci. Forum, vols. 457-460 (2004) pp. 9-14.

M. Fanton et al.; "Growth of Bulk SiC by Halide Chemical Vapor Deposition", Mat. Sci. Forum, vols. 457-460 (2004) pp. 87-90.

P. Wellman et al.; "Modified Physical Vapor Transport Growth of SiC—Control of Gas Phase Composition for Improved process Condition", Mat. Sci. Forum, vols. 483-485 (2005) pp. 25-30.

M.A. Fanton et al.; "Growth of SiC Boules With Low Boron Concentration"; Materials Science Forum, vols. 527-529 (2006).

G.F. Hewitt; Chemistry and Physics of Carbon-A Series of Advances; Edited by Philip L. Walker, Jr.; vol. 1; Copyright 1965 by Marcel Dekker, Inc. New York; pp. 73-119.

* cited by examiner

SILICON CARBIDE SINGLE CRYSTALS WITH LOW BORON CONTENT

CROSS REFERENCE TO RELATED APPLICATIONS

This application claims priority from U.S. provisional patent application No. 60/847,318, filed on Sep. 26, 2006, and is a continuation-in-part of U.S. patent application Ser. No. 11/784,971, filed Apr. 10, 2007, the contents of both of which are incorporated herein by reference.

BACKGROUND OF THE INVENTION

1. Field of the Invention

The present invention relates to the growth of SiC crystals having a reduced boron content.

2. Description of Related Art

Wafers of semi-insulating silicon carbide of 4H and 6H polytypes serve as lattice-matched substrates to grow epitaxial layers of SiC and AlGaN, which are used for the fabrication of SiC- and AlGaN-based microwave devices. In order for the devices to work efficiently, the substrates must be semi-insulating, that is, fully compensated electronically. In practical terms, it is required that the resistivity of the SiC substrate must be higher than $10^5$ Ohm·cm, and desirably above $10^6$ Ohm·cm, and even more desirably above $10^7$ Ohm·cm, as measured at room temperature and under normal room light.

Electronic properties of semiconductors are determined by their electronic band structure, particularly by the bandgap, which is an energy gap that separates the valence band from the conductance band and is typically expressed in electron-volts (eV). The bandgap of silicon carbide is 3 eV for 6H polytype and 3.2 eV for 4H polytype. In ideal semiconductors that contain no impurities or defects, there are no energy levels within the bandgap and their electrical conductance is determined by electronic transitions between the valence and conduction bands. Due to the large value of the SiC bandgap, the calculated electrical resistivity of the "ideal" SiC is extremely large—about $10^{20}$ Ohm·cm at room temperature.

In reality, however, semiconductor crystals contain impurities and defects which lead to the appearance of impurity- and defect-related electronic levels within the bandgap. Electronic properties of such "non-perfect" semiconductors are determined to a very large degree by electronic transitions involving these extrinsic levels in the bandgap. Impurity and defect levels lying close to the edges of the bandgap are called "shallow". In 4H and 6H SiC, nitrogen is a shallow donor having its level at about 0.1 eV below the conduction band, while boron is a shallow acceptor with its level at about 0.3 eV above the valence band. Due to the relatively small energy gaps separating shallow levels from the band edges, they are thermally ionized at room temperature producing free charge carriers either in the conduction band (free electrons) or in the valence band (free holes). This makes the room-temperature electrical resistivity low. As an example, the resistivity of SiC crystals containing boron can be as low as 0.5 Ohm·cm.

Extrinsic levels positioned closer to the midgap are called "deep" levels. Vanadium and some point defects produce deep levels in SiC, which are at 0.8-1.5 eV from the band edges. Due to the relatively large energy gaps that separate deep levels from the band edges, they are not thermally ionized at room temperature and, therefore, do not supply free charge carriers. On the contrary, deep levels are capable of removing free charge carriers from the conductance and valence bands, thus leading to the increased electrical resistivity. This phenomenon is called "electronic compensation", hereinafter referred to as "compensation".

The net shallow impurity concentration in a semiconductor is defined as the absolute value of $N_D-N_A$, where $N_D$ and $N_A$ are the concentrations of shallow donors and acceptors, respectively. A semiconductor is fully compensated when the concentration of deep levels is higher than the net shallow impurity concentration. Doping with vanadium and introduction of deep point defects has been used for compensation of silicon carbide.

The solubility of boron in silicon carbide is very high (up to 0.1-0.5%), and unintentional boron acceptors can be present in sublimation-grown SiC crystals at levels as high as $1 \cdot 10^{18}$ cm$^{-3}$. In order to achieve reliable compensation, the concentration of deep levels should be higher than this level. In general, introduction of deep levels in high concentrations is technologically difficult and can cause stress and generation of defects. A better approach to full compensation would be through a reduced presence of unintentional shallow impurities, including boron.

Physical Vapor Transport (PVT) is the most common sublimation technique used for SiC crystal growth. A schematic diagram of the conventional PVT arrangement is shown in FIG. 1. Generally, growth is carried out in a graphite crucible 1 sealed with a graphite lid 2 and loaded with a sublimation source 3 and a seed 4. Generally, a polycrystalline SiC source 3 is disposed at the bottom of the crucible 1 and a SiC seed 4 at the top of crucible 1. The seed 4 is often mounted directly to the crucible lid 2 using adhesives or other suitable means. Crucible 1 is heated to a growth temperature, generally between 2000° C. and 2400° C., where source 3 vaporizes and fills crucible 1 with volatile molecular species of $Si_2C$, $SiC_2$ and Si. During growth, the temperature of source 3 is maintained higher than the temperature of the seed 4. This temperature difference forces the vapors from source 3 to migrate and precipitate on seed 4 forming a single crystal 5. In order to control the growth rate and ensure high crystal quality, PVT growth is carried out under a small pressure of inert gas, generally between several and 200 Torr.

It is known that the permeability of graphite depends on the nature of the gas diffusing through graphite. Graphite is generally permeable to inert gases, hydrogen and nitrogen, but has a much lower permeability to the elements that form stable carbides. Accordingly, graphite has a very low permeability to the vapors formed during sublimation of silicon carbide, such as Si, $Si_2C$ and $SiC_2$. Therefore, conventional PVT can be viewed as a "closed" process, in which the Si-bearing vapors practically do not leave the growth crucible, except small unintentional losses that can occur through the joint between the crucible body 1 and lid 2.

SiC single crystals have also been grown using "open" processes, where a deliberate gas flow was established between the crucible interior and exterior. Examples include High Temperature Chemical Vapor Deposition (HTCVD), Halide Chemical Vapor Deposition (HCVD) and some PVT modifications. A generalized diagram of the open SiC growth process is shown in FIG. 2. Similarly to the closed sublimation growth process, the open process is carried out in a graphite crucible 1, wherein source 3 is disposed at the crucible bottom and seed 4 is disposed at the crucible top. Graphite crucible 1 used in the open process is provided with a gas inlet 7 and gas outlet(s) 9. A gas mixture 6, that may contain Si precursors, C precursors, dopants and other gaseous components, enters the crucible through an inlet 7. Once inside the crucible 1, the reactants undergo chemical transformations in a reaction zone 8. The gaseous reaction products blend with the vapors originating from solid source 3 and move toward seed 4, where they precipitate on seed 4 and form single crystal 5. Gaseous byproducts escape through gas outlet(s) 9. In the process of Halide Chemical Vapor Deposition (HCVD), the silicon and carbon precursors are delivered to the reaction zone 8 in the form of silicon tetrachloride ($SiCl_4$) and propane ($C_3H_8$) mixed with a large excess of hydrogen. The main drawback of the open SiC sublimation growth process is related to severe losses of Si-bearing vapors through the outlet port(s) 9.

Graphite is widely utilized in SiC sublimation growth as a material for crucibles, seed-holders, heat shields and other parts. The starting materials used in graphite manufacturing (coke and pitch) contain boron. Therefore, boron is always present in graphite, where its atoms are chemically bound to carbon. High-temperature treatment under a halogen-containing atmosphere is widely used by graphite manufacturers for purification. During purification, the halogen molecules penetrate the graphite bulk, react with various impurities and form volatile halides with them. Driven by the concentration gradient, the halide molecules diffuse from the graphite bulk toward the surface, where they are removed by the flow of the carrier gas. Typically, removal of metallic impurities from graphite is more efficient than removal of boron.

Conventionally, graphite manufacturers characterize graphite purity by the "ash content", i.e., the amount of ash that remains after a graphite specimen is burnt in oxygen. The best-purity commercially available graphite contains between 5 and 20 ppm of ash by weight. Boron forms volatile oxide upon burning in oxygen; therefore, graphite manufacturers seldom specify boron content in graphite. Impurity analyses using Glow Discharge Mass Spectroscopy (GDMS) show that the boron content even in the lowest-ash graphite is, typically, above 0.2 ppm and, in some cases, up to 1 ppm.

Furnaces used for graphite purification are, typically, very large and capable of accommodating metric tons of graphite. Cross-contamination between different items in a large graphite batch and contamination from the furnace itself limit the purification efficiency. As a result of the above limitations, graphite with a boron content below 0.1 ppm by weight is not readily available on a regular commercial basis.

Optimization of conventional PVT sublimation growth, including protective coatings applied to interior surfaces of a graphite crucible, has led to the reduction of boron in the grown SiC crystals to $(2-3) \cdot 10^{16}$ cm$^{-3}$. However, in order to produce semi-insulating SiC crystals of better quality and with superior electrical parameters, the concentration of unintentional boron must be reduced to levels below $10^{16}$ cm$^{-3}$.

SUMMARY OF THE INVENTION

The strong reduction of unintentional boron in SiC crystals can be achieved if the growth process is combined with simultaneous removal of boron from the growth crucible. It is believed that heretofore in-situ purification of SiC crystals during growth was not known in the art.

SiC sublimation growth utilizes crucibles, seed-holders, heat shields and other parts made of graphite. Generally, graphite contains detectable levels of boron impurity, which can contaminate the growing crystal. To overcome this problem, SiC sublimation growth is carried out in the presence of dynamic reactive atmosphere comprised of an inert carrier gas and at least one reactive gas. The flow of reactive gas is supplied into the graphite growth crucible through an inlet port, and it escapes the crucible by filtering out across the permeable crucible wall.

The main reactive component of the gas mixture is a halosilane gas, desirably tetrahalosilane, such as tetrachlorosilane ($SiCl_4$) or tetrafluorosilane ($SiF_4$). The halosilane additive is added in concentrations between 0.1 and 10% by volume and, more desirably, between 1 and 5%. At high temperatures of SiC sublimation growth, the halosilane undergoes pyrolysis forming lower halosilanes, such as $SiCl_3$ and $SiCl_2$. The products of pyrolysis react with boron forming volatile boron halides, such as $BCl$, $BCl_2$ and $BCl_3$. The boron-containing byproducts are removed from the interior of the growth crucible by the flow of the gas mixture, which passes across (through) the permeable crucible wall.

Lower halosilanes can attack the SiC source and growing crystal, leading to losses of silicon from the growth charge. In order to reduce these losses, the gas mixture can include small amounts of hydrogen, desirably between 0.1 to 3% by volume. The presence of hydrogen shifts the thermodynamic equilibrium in the gas phase in such a fashion that chemical attack on the SiC source and crystal is reduced.

The grown crystals are characterized by the concentration of unintentional boron acceptor below $7 \cdot 10^{15}$ cm$^{-3}$ and resistivity above $10^7$ Ohm·cm.

A crystal growth method in accordance with one non-limiting embodiment includes (a) providing an enclosed growth crucible inside of a growth chamber with a thermal insulation disposed therebetween, the growth crucible having polycrystalline source material and a seed crystal disposed in spaced relation therein; (b) heating the interior of the growth crucible such that a temperature gradient forms between the source material and the seed crystal, the source material is heated to a sublimation temperature and the temperature gradient is sufficient to cause sublimated source material to be transported to the seed crystal where the sublimated source material precipitates on the seed crystal; and (c) causing a gas mixture to flow into the growth crucible and between the polycrystalline source material and an interior surface of the growth crucible, whereupon the gas mixture reacts with an unwanted element in the body of the growth crucible to form a gaseous byproduct which flows through the growth crucible to the exterior of the growth crucible, which is formed of a material that is permeable to the gas mixture and the gaseous byproduct, under the influence of the flow of the gas mixture into the growth crucible, wherein the unwanted element is boron and the gas mixture comprises the combination of (a) halosilane gas and (b) an inert gas.

The inert gas can be either argon or helium.

The halosilane gas can be tetrahalosilane in a concentration in the gas mixture between either 0.1% and 10% by volume, or between 1% and 5% by volume.

The gas mixture can further include hydrogen. The concentration of hydrogen in the gas mixture can be between 0.1% and 3% by volume.

The polycrystalline source material can be disposed in a source crucible which is disposed inside the growth crucible in spaced relation to interior surfaces of the growth crucible. An exterior of a base of the source crucible can be disposed in spaced relation to an interior of a floor of the growth crucible, thereby defining a first gap therebetween. An exterior of a wall of the source crucible can be disposed in spaced relation to an interior of a wall of the growth crucible, thereby defining a second gap therebetween. The gas mixture can flow in the first and second gaps.

The flow of the gas mixture can be between 20 and 200 sccm.

The wall(s) of the growth crucible can have a thickness that is between either 4 mm and 20 mm, or between 8 mm and 16 mm.

The growth crucible can be made from graphite. The growth chamber can be made from fused silica. The thermal insulation can be made from a porous graphite.

The source material and the seed crystal can both be made from SiC.

A crystal growth method in accordance with another non-limiting embodiment comprises (a) providing a seed crystal and a source material in spaced relation inside of a growth crucible is made from a material that is at least in-part gas permeable and which includes an element in the body thereof that is not wanted in a crystal grown in the growth crucible; (b) heating the growth chamber whereupon the source material sublimates and is transported via a temperature gradient in the growth chamber to the seed crystal where the sublimated source material precipitates; and (c) concurrent with step (b), causing a gas mixture to flow inside the growth crucible in a manner whereupon the unwanted element reacts with the gas mixture and is transported to the exterior of the growth crucible via the at-least gas permeable part thereof.

The gas mixture can flow through the growth crucible at a rate between 20 standard cubic centimeters per minute (sccm) and 200 sccm.

The source material can be disposed in a source crucible that is positioned inside the growth crucible. The exterior wall of the source crucible can be spaced from an interior wall of the growth crucible. The space can be between 4 mm and 7 mm.

The unwanted element can be boron. The gas mixture can be a combination of (a) halosilane gas and (b) an inert gas.

The growth crucible can be comprised of graphite. The source material and the seed crystal can comprise SiC.

DETAILED DESCRIPTION OF THE INVENTION

The following embodiment will be described with reference to the accompanying figures where like reference numbers correspond to like elements.

SiC sublimation growth is conducted under a dynamic reactive atmosphere containing halogen. Halogen converts boron, whether free or chemically bound, into volatile boron halides that are removed from the interior of the growth crucible by the flow of inert carrier gas filtering across the permeable crucible wall.

Figure 1:
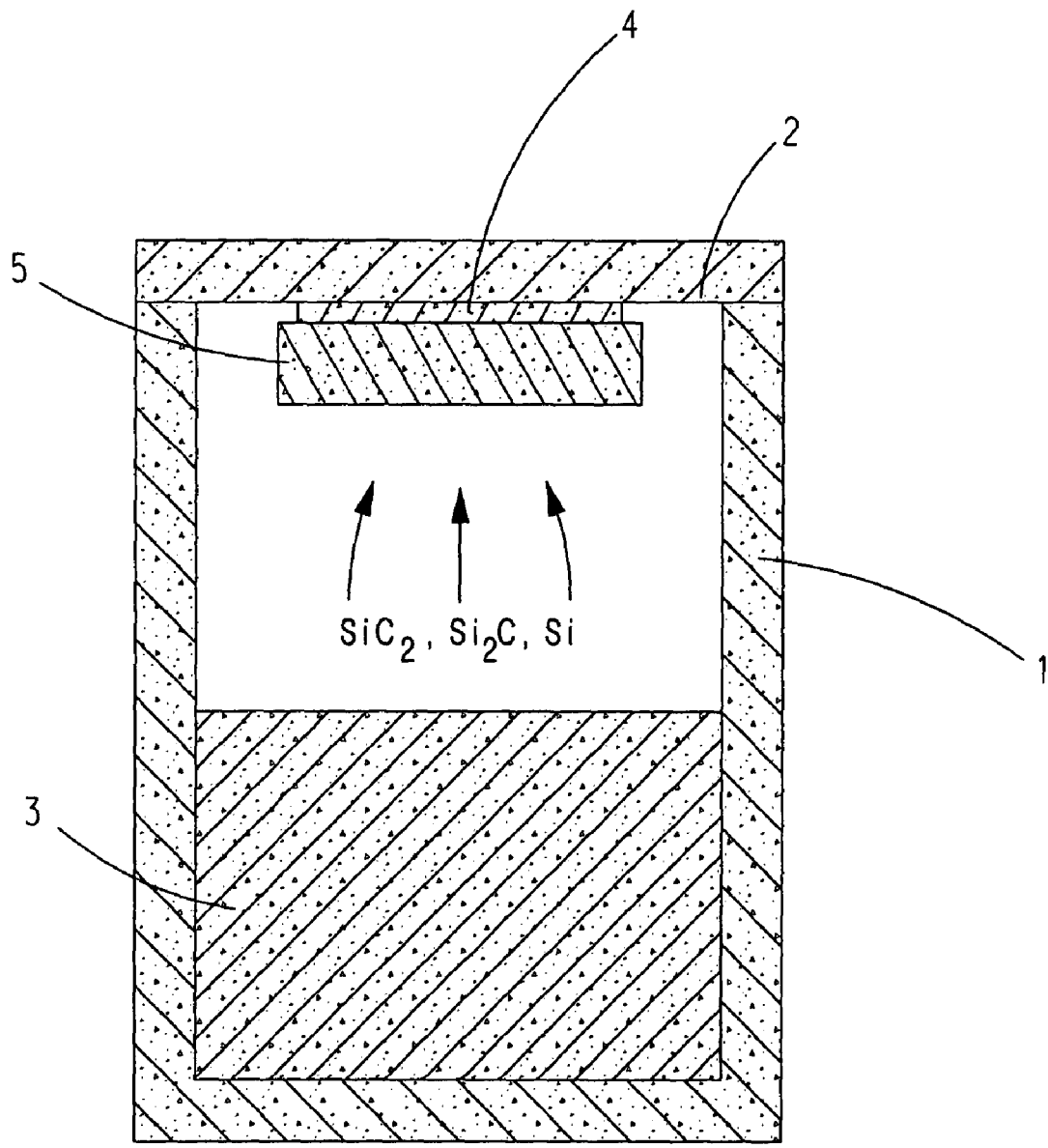
FIG. 1 is a schematic diagram of a prior art, closed physical vapor transport sublimation growth system.
Figure 2:
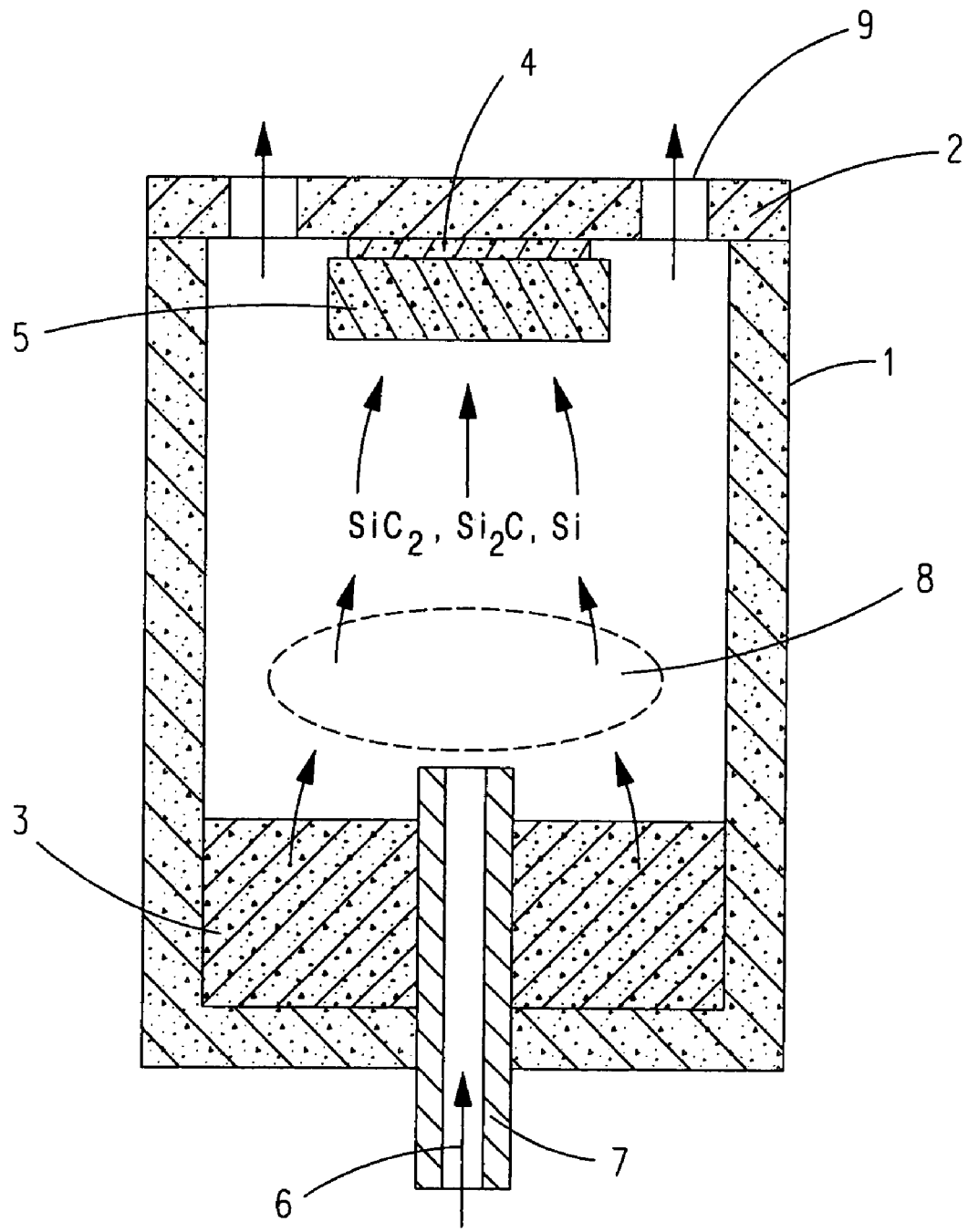
FIG. 2 is a schematic diagram of a prior art, open physical vapor transport sublimation growth system.
Figure 3:
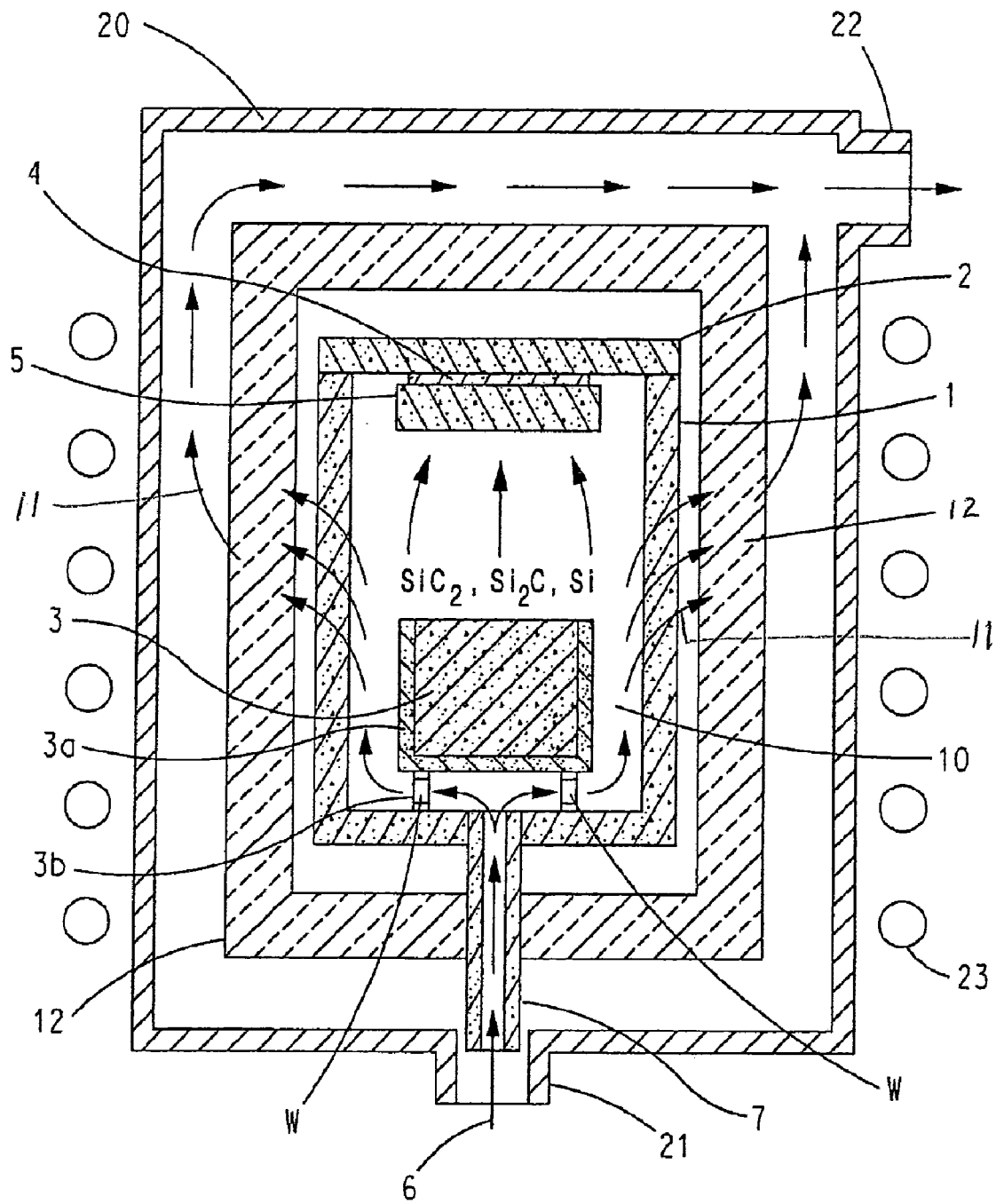
FIG. 3 is a physical vapor transport sublimation growth system for the removal of boron in accordance with the embodiment described herein.

With reference to FIG. 3, more specifically, PVT sublimation growth of silicon carbide is carried out in a graphite growth crucible 1 sealed with a graphite lid 2. Desirably, crucible 1 and lid 2 are made of high-density, fine-grain and low-porosity graphite, such as "ATJ" available from Union Carbide Corporation of Danbury, Conn., under registered trademark UCAR® (registration number 1008278), or similar. Growth crucible 1 is loaded with a SiC polycrystalline source 3 and a seed crystal 4. Source 3 is disposed in a lower portion of the crucible 1 while seed 4 is disposed at the top of the crucible, desirably attached to crucible lid 2, as shown in FIG. 3. Source 3 is contained in a thin-walled graphite source crucible 3a, which rests on a graphite pedestal 3b. The dimensions of growth crucible 1, source crucible 3a and pedestal 3b are such that a gap 10 exists between the wall of the source crucible 3a and the wall of the growth crucible 1. Desirably, this gap is between 4 and 7 mm wide.

Growth crucible 1, loaded with source 3 and seed crystal 4, is placed inside a chamber 20 of the growth station, where it is surrounded by a thermal insulation 12. Thermal insulation 12 is made of lightweight fibrous graphite, such as graphite felt or foam. The growth station includes a means for heating crucible 1 to a growth temperature. In one particular embodiment, the chamber 20 is water-cooled and is made of fused silica, and the heating means is realized by an exterior RF coil 23. Metal chambers with resistive heaters or RF coils located inside the chamber can also or alternatively be utilized.

In order to initiate sublimation growth, crucible 1 is heated to the growth temperature, desirably between 2000° C. and 2400° C. At the growth temperature, SiC source 3 sublimes and fills the interior of the crucible 1 with vapor including Si, $Si_2C$ and $SiC_2$ volatile molecules. During growth, the temperature of source 3 is kept higher than the temperature of seed crystal 4. This results in vapor transport in the direction from source 3 to seed crystal 4. After reaching seed crystal 4, the vapors condense thereon causing growth of a SiC single crystal 5 on seed crystal 4.

During growth of single crystal 5, a gas mixture 6 is supplied into growth crucible 1 by passing first through an inlet 21 of chamber 20 and then through an inlet port 7 of crucible 1. After entering growth crucible 1, gas mixture 6 flows through windows W in pedestal 3b and in the gap 10 formed between walls of growth crucible 1 and the source crucible 3a, as shown in FIG. 3.

Gas mixture 6 supplied into growth crucible 1 is comprised of an inert carrier gas, desirably argon or helium, and one or more reactive gaseous additives. The main reactive additive is a halosilane gas, desirably tetrahalosilane ($SiCl_4$ or $SiF_4$). The concentration of halosilane in the gas mixture is desirably between 0.1 and 10% by volume, and more desirably between 1 and 5%. The gas mixture may contain another reactive gaseous additive, such as hydrogen. The concentration of hydrogen is desirably between 0.1 and 3% by volume.

Inside growth crucible 1, the halosilane gas reacts with boron and converts it into volatile boron halides. These gaseous boron byproducts are removed from the interior of the crucible 1 by filtering through the permeable wall of the crucible 1. Thereafter, these byproducts are removed from growth chamber 20 through an outlet port 22 by the flow of gas mixture 6 into growth chamber 20.

The chemical form of boron in the conditions of SiC sublimation growth is not exactly known. It is assumed that at high temperatures and in the presence of carbon and SiC, boron can be either in the form of elemental boron vapor, or in the form of a chemical compound with carbon, or in the form of a chemical compound with silicon. It is commonly believed that boron contained in graphite bulk is chemically bound to carbon and forms chemical bonds similar to those of boron carbide, $B_4C$.

At the high temperatures of SiC sublimation growth, the halosilane additive undergoes pyrolysis. Pyrolysis of tetrahalosilane produces lower halosilanes. For example, the main products of $SiCl_4$ pyrolysis are $SiCl_2$ and $SiCl_3$. Thermodynamic analysis shows that, independently of the chemical form of boron, whether elementally or chemically bound to carbon or silicon, the lower halosilanes would react with boron-containing molecules and produce volatile boron halides, such as $BCl$, $BCl_2$ and $BCl_3$.

Argon and helium, as well as gaseous boron halides, have sufficient permeability in graphite. Therefore, efficient removal of gaseous boron byproducts from growth crucible 1 can be realized by establishing their flow across the permeable wall of crucible 1. This can be achieved using the flow of carrier gas 6 across the crucible wall. In FIG. 3, arrows 11 symbolize the removal of boron halide products with the flow of carrier gas 6 passing across the crucible wall.

An additional benefit of the halosilane reactive additive is in its ability to react with boron contained in the bulk of graphite. While filtering across the crucible wall, carrier gas 6 delivers the products of halosilane pyrolysis into the graphite bulk, where they react with boron chemically bound to carbon. The flow of inert carrier gas 6 across the crucible wall facilitates the removal of volatile boron halides to the exterior of growth crucible 1.

At high temperatures, certain products of halosilane pyrolysis can attack SiC source 3 and growing crystal 5. For instance, higher halosilane $SiCl_3$ can attack SiC leading to the appearance of free carbon and lower halosilane $SiCl_2$. This process can lead to removal of silicon from growth crucible 1, depletion of the SiC source 3 by silicon, and erosion of the SiC crystal 5. In order to avoid this, the gas mixture supplied into crucible 1 contains a small amount of hydrogen. The presence of hydrogen in the gas phase leads to the appearance of small quantities of hydrogen halides (HCl in the case of $SiCl_4$ and HF in the case of $SiF_4$) and shifts the thermodynamic equilibrium in such a fashion that chemical attack on the SiC source 3 and crystal 5 is greatly reduced. In order to achieve this, the amount of hydrogen in the gas mixture is desirably between 0.1 to 3% by volume.

In order for boron removal to be effective, the flow of gas mixture 6 is desirably between 20 sccm and 200 sccm. Too high of a flow can create a harmful overpressure inside crucible 1 and/or disturb the growth process, while too low of a flow can be ineffective or lead to the escape of Si-bearing vapors through the inlet port 7 of crucible 1.

The crucible wall should be thin enough to allow efficient escape of the volatile boron halides by filtering/diffusion. At the same time, the crucible wall must not be too thin, otherwise, it may become transparent to the silicon-bearing vapors such as $SiC_2$, $Si_2C$ and Si and cause Si losses from the crystal growth source 3. Desirably, the thickness of the graphite crucible wall is desirably between 4 mm and 20 mm and, more desirably, between 8 mm and 16 mm.

In summary, removal of boron from the growth crucible is carried out in-situ during SiC crystal growth. To this end, a reactive gas mixture is supplied into the growth crucible through an inlet port, and it escapes the crucible by filtering out through the permeable crucible wall. The gas mixture is comprised of an inert carrier gas and a halosilane gas, desirably $SiCl_4$ or $SiF_4$, added in quantities between 0.1 and 10% by volume, and more desirably between 1 and 5%. Even more desirably, a small amount of hydrogen is added to the gas mixture in concentrations between 0.1 and 3% by volume. At high temperatures, the halosilane additive undergoes pyrolysis. The pyrolysis products react with boron, including boron residing in graphite. As a result of reaction, volatile boron halides are produced. Subsequently, they are removed from the growth crucible by filtering out across the permeable crucible wall, assisted by the flow of carrier gas. The hydrogen additive reduces the chemical attack of the SiC source and crystal and losses of silicon from the growth crucible. The grown crystal 5 has a concentration of unintentional boron acceptor below $7 \cdot 10^{15}$ cm$^{-3}$ and resistivity above $10^7$ Ohm·cm.

In summary, the foregoing description discloses, among other things:

A process for sublimation growth of SiC single crystals, in which growth is carried out under dynamic reactive atmosphere.

The use of a reactive atmosphere for SiC sublimation growth comprised of an inert carrier gas, desirably, pure argon or helium, mixed with reactive gas additives.

The use of a reactive gas additive comprising a halosilane, desirably $SiCl_4$ or $SiF_4$.

The use of a reactive atmosphere for SiC sublimation growth, which includes a combination of halosilane and hydrogen.

The use of a reactive atmosphere for SiC sublimation growth, in which the concentration of halosilane is desirably between 0.1 and 10% by volume, and more desirably between 1 and 5% by volume.

The use of a reactive atmosphere for SiC sublimation growth, in which the concentration of hydrogen is desirably between 0.1 and 3% by volume.

A process of PVT sublimation growth under a continuous flow of a reactive gas mixture, in which the reactive gas mixture enters the growth crucible through an inlet port and escapes the crucible by filtering across the permeable crucible wall.

A process of PVT sublimation growth under continuous flow of a reactive gas mixture, where the flow rate of the gas mixture is desirably between 10 sccm and 200 sccm, and more desirably between 20 sccm and 100 sccm.

A growth crucible made of dense, fine-grain and low-porosity graphite having the wall desirably between 4 mm and 20 mm thick, and more desirably between 8 mm and 16 mm thick.

A SiC sublimation growth process, in which the SiC source is contained in a thin-walled crucible disposed inside the growth crucible in such a fashion that a gap exists between the base and wall of the growth crucible and the base and wall of the source crucible. The gap between the walls of the growth crucible and the source crucible is desirably between 2 mm and 10 mm wide, and more desirably between 4 mm and 7 mm wide.

SiC single crystals of 4H, 6H, 15R and 3C polytypes having unintentional boron acceptor in concentrations below $7 \cdot 10^{15}$ cm$^{-3}$.

Technical advantages of the above-described method and apparatus include:

Reduced concentration of unintentional boron acceptors in 6H and 4H SiC crystals;

Higher and spatially more uniform resistivity in semi-insulating SiC crystals; and Higher yield of semi-insulating substrates per boule.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A crystal growth method comprising:
    (a) providing an enclosed growth crucible inside of a growth chamber with a thermal insulation disposed therebetween, the growth crucible having polycrystalline source material and a seed crystal disposed in spaced relation therein;
    (b) heating the interior of the growth crucible such that a temperature gradient forms between the source material and the seed crystal, the source material is heated to a sublimation temperature and the temperature gradient is sufficient to cause sublimated source material to be transported to the seed crystal where the sublimated source material precipitates on the seed crystal; and (c) causing a gas mixture to flow directly into the growth crucible and into a gap between the polycrystalline source material in the growth crucible and an interior surface of the growth crucible, whereupon the gas mixture reacts with an unwanted element in the body of the growth crucible to form a gaseous byproduct which, under the influence of the gas mixture flowing directly into the growth crucible, flows through a body of the growth crucible to the exterior of the growth crucible, which is formed of a material that is permeable to the gas mixture and the gaseous byproduct, under the influence of the flow of the gas mixture into the growth crucible, wherein the unwanted element is boron and the gas mixture comprises the combination of (a) halosilane gas and (b) an inert gas.

2. The method of claim 1, wherein the inert gas is either argon or helium.

3. The method of claim 1, wherein the halosilane gas is tetrahalosilane in a concentration in the gas mixture between either 0.1% and 10% by volume, or between 1% and 5% by volume.

4. The method of claim 1, wherein the gas mixture further comprises hydrogen.

5. The method of claim 4, wherein the concentration of hydrogen in the gas mixture is between 0.1% and 3% by volume.

6. The method of claim 1, wherein:
the polycrystalline source material is disposed in a source crucible which is disposed inside the growth crucible; and
the gap is defined between an exterior surface of the source crucible and an interior surface of the growth crucible.

7. The method of claim 6, wherein the gap includes:
a first gap between an exterior of a base of the source crucible disposed in spaced relation to an interior of a floor of the growth crucible; and
a second gap between an exterior of a wall of the source crucible disposed in spaced relation to an interior of a wall of the growth crucible, wherein the gas mixture flows in the first and second gaps.

8. The method of claim 1, wherein the flow of the gas mixture is between 20 standard cubic centimeters per minute (sccm) and 200 sccm.

9. The method of claim 1, wherein the wall(s) of the growth crucible have a thickness that is between either 4 mm and 20 mm, or between 8 mm and 16 mm.

10. The method of claim 1, wherein:
the growth crucible is made from graphite;
the growth chamber is made from fused silica; and
the thermal insulation is made from a porous graphite.

11. The method of claim 1, wherein the source material and the seed crystal are both made from SiC.

12. A crystal growth method comprising:
(a) providing a seed crystal and a source material in spaced relation inside of a growth crucible, wherein a body of the growth crucible-is made from a material that is at least in-part gas permeable and which includes an element that is not wanted in a crystal grown in the growth crucible;
(b) heating the growth crucible whereupon the source material sublimates and is transported via a temperature gradient in the growth crucible to the seed crystal where the sublimated source material precipitates; and
(c) concurrent with step (b), causing a gas mixture to flow directly into the interior of the growth crucible in a manner whereupon the unwanted element in the body of the growth crucible reacts with the gas mixture and is transported, under the influence of the gas mixture flowing directly into the growth crucible, to the exterior of the growth crucible via the at-least gas permeable part of the body of the growth crucible.

13. The method of claim 12, wherein the gas mixture is caused to flow through the growth crucible at a rate between 20 sccm and 200 sccm.

14. The method of claim 12, wherein the source material is disposed in a source crucible that is positioned inside the growth crucible.

15. The method of claim 14, wherein an exterior wall of the source crucible is spaced from an interior wall of the growth crucible defining a gap between the source crucible and the growth crucible where the gas mixture flows.

16. The method of claim 15, wherein the gap is between 4 mm and 7 mm.

17. The method of claim 12, wherein at least one of:
the unwanted element is boron; and
the gas mixture is the combination of (a) halosilane gas and (b) an inert gas.

18. The method of claim 12, wherein the growth crucible is comprised of graphite.

19. The method of claim 12, wherein the source material and the seed crystal comprise SiC.

20. A crystal growth method comprising:
introducing a polycrystalline source material and a seed crystal into a physical vapor transport (PVT) growth system;
PVT growing sublimated source material on the seed crystal in the PVT growth system; and
promoting PVT growth of the sublimated source material on the seed crystal by introducing halosilane gas into the PVT growth system during said PVT growth.

21. The method of claim 20, wherein the source material and the seed crystal are both made from SiC.

22. A crystal growth method comprising:
introducing a polycrystalline source material and a seed crystal into a PVT growth system; and
in the PVT growth system, PVT growing a single crystal on the seed crystal via precipitation of sublimated source material on the seed crystal in the presence of a flow of halosilane gas that reacts with and removes an unwanted element from the PVT growth system during said PVT growth.

23. The method of claim 22, wherein the unwanted element is boron.

24. The method of claim 22, wherein the single crystal is PVT grown in the presence of a flow of a gas mixture that includes the halosilane gas in a concentration between either 0.1% and 10% by volume, or between 1% and 5% by volume of the gas mixture.

* * * * *